United States Patent
Takahashi et al.

(10) Patent No.: US 6,618,280 B2
(45) Date of Patent: *Sep. 9, 2003

(54) ASSOCIATIVE MEMORY FOR ACCOMPLISHING LONGEST COINCIDENCE DATA DETECTION BY TWO COMPARING OPERATIONS

(75) Inventors: Noriaki Takahashi, Miyagi (JP); Hideaki Odagiri, Chiba (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/142,891

(22) Filed: May 13, 2002

(65) Prior Publication Data

US 2002/0131288 A1 Sep. 19, 2002

Related U.S. Application Data

(63) Continuation of application No. 09/756,212, filed on Jan. 9, 2001, now Pat. No. 6,388,909.

(30) Foreign Application Priority Data

Jan. 18, 2000 (JP) ........................................ 2000-008714

(51) Int. Cl.[7] .............................................. G11C 15/00
(52) U.S. Cl. ................ 365/49; 365/230.03; 365/230.06
(58) Field of Search .............................. 365/49, 230.03, 365/230.06, 230.01

(56) References Cited

U.S. PATENT DOCUMENTS

| 6,098,147 A | 8/2000 | Mizuhara |
| 6,175,514 B1 | 1/2001 | Henderson et al. |
| 6,181,591 B1 | 1/2001 | Miyatake et al. |
| 6,230,236 B1 | 5/2001 | Schultz et al. |

FOREIGN PATENT DOCUMENTS

JP    11-7782    1/1999

*Primary Examiner*—Hoai Ho
(74) *Attorney, Agent, or Firm*—Rabin & Berdo, P.C.

(57) ABSTRACT

An associative memory includes an array of CAM cells each having a transistor indicating a result from comparing a stored bit with a reference bit. The transistors are connected in serial in each row of the array to form a NAND circuit producing a signal representing that the bits stored in all the cells in the row are consistent with the reference bits or otherwise that the cell at the LSB of the row stores a bit consistent with a reference bit. Each column of the array includes a logic circuit for masking the bits except those continuous from the MSB toward the LSB which correspond to the bits of a word having the most bits continuous from the MSB toward the LSB and consistent with the bits of the reference word among the stored words. The NAND circuit in a row of the cells storing a word having the most bits continuous from the MSB toward the LSB and consistent with the corresponding bits of a reference word develops a signal representing the longest coincidence data detected.

14 Claims, 5 Drawing Sheets

ASSOCIATIVE MEMORY FOR ACCOMPLISHING LONGEST COINCIDENCE DATA DETECTION BY TWO COMPARING OPERATIONS

CROSS REFERENCE TO RELATED APPLICATION

This application is a continuation of application Ser. No. 09/756,212, filed Jan. 9, 2000, now U.S. Pat. No. 6,388,909, the disclosure of which is incorporated herein by reference.

BACKGROUND OF THE INVENTION

1. Field of the Invention

The present invention relates to an associative memory, more particularly to an associative memory for developing the address of a storage location storing therein data detected by the longest coincidence data detection principle.

2. Description of the Background Art

As is known in the art, the associative memory, or often called CAM (Content Addressable Memory), is adapted to include storage locations and develop data representative of the address of one of the storage locations which contains data coincident with input or reference data entered. The associative memory is advantageously applicable to searching for routing information in telecommunications network systems, for example.

With the longest coincidence data detection system, the associative memory is adapted to receive input data and produce output data representative of the address of a storage location which stores therein data of which all of the bits are coincident with the corresponding bits of the input data, or otherwise produce data which have the most bits continuous from the MSB (Most Significant Bit) position toward the LSB (Least Significant Bit) position that are coincident with the corresponding bits of the input data. The CAM memory is generally provided with measures for masking a specific bit or bits of a reference word of data to exclude the bit or bits from the coincidence detection.

An example of the longest coincidence data detection system is disclosed in Japanese patent laid-open publication No. 7782/1999, equivalent to U.S. Pat. No. 6,098,147 to Mizuhara. The apparatus for detecting the longest coincidence data disclosed in the U.S. patent compares a word of data stored in the associative memory and coincident with a reference word of data with bits from the LSB position thereof masked being increased on a bit-by-bit basis by an incrementing device such as a counter to determine which bit position or positions continuous from the MSB of the stored word of data is or are coincident with a corresponding bit or bits of the reference word of data.

The system of increasing the mask bits one by one to detect the longest coincidence data requires an extensive period of time until a coincidence is found out. For example, an application which is popular in telecommunications network systems, and in which an address value represented by 32 bits is input to an associative memory as a reference word of data, would require 32 comparison operations at the worst. As taught by the U.S. patent, the CAM unit is divided into four subsections, for example, each including eight bit positions, or one byte length, requiring the comparison operations to be repeated eight times.

In an application of the CAM system structured as mentioned above to search for routing information in a network system, the extensive period of time required for finding coincidence would result in a reduced throughput, thus causing the efficiency of the network to unfavorably be decreased.

The comparison operation of the CAM unit suffers from charging and discharging the stray capacitance caused by a lot of lengthy wiring. The conventional comparison operations continuously and repetitively accomplished in the CAM unit would consume much more electric power.

SUMMARY OF THE INVENTION

It is an object of the present invention to provide an improved associative memory.

More specifically, it is another object of the present invention to provide an associative memory for accomplishing the longest coincidence data detection in a minimum period of time.

Further, it is another object of the present invention to provide an associative memory advantageously applicable to telecommunications network systems.

It is still another object of the present invention to provide an associative memory with its power consumption minimized.

In accordance with the present invention, an associative memory comprises: an array of CAM cells each for storing therein a bit of data fed on a bit line, said array being formed in rows corresponding to words of the data and columns corresponding to bits of the word; each of said CAM cells comprising a first transistor circuit taking either one of a first and a second state, the first and the second state representing that the bit stored in said CAM cell is consistent and inconsistent, respectively, with a bit of a reference word fed on the bit line; a first plurality of logic circuits provided correspondingly to the rows, each of said first plurality of logic circuits producing a first signal representing that the first transistor circuits of all of the CAM cells in corresponding one of the rows take the first state, and otherwise which of the first and second states the first transistor circuit of the CAM cell at an LSB position of the corresponding one row takes; a second plurality of logic circuits provided correspondingly to the columns, each of said second plurality of logic circuits detecting whether or not all of the first transistor circuits in corresponding one of the columns take the first state, and producing a second signal when all of the first transistor circuits in the corresponding one column take the first state; and a plurality of drive circuits provided correspondingly to the columns for each receiving a bit of an input or reference word, and driving the bit line of said CAM cells in corresponding one of the columns in response to the bit received; each of said drive circuits being operative in response to the second signal produced from corresponding one of said second plurality of logic circuits to mask the bit line to cause the first transistor circuits of all of the CAM cells in the corresponding one column to take the first state; whereby the first signal is developed from the first logic circuit in one of the rows which includes the first transistor circuits all of which take the first state to thereby accomplish a longest coincidence data detection.

More specifically, an associative memory includes an array of CAM cells each having a transistor indicating a result from comparing a stored bit with a reference bit. The transistors are connected in serial in each row of the array to form a NAND circuit producing a signal representing that the bits stored in all the cells in the row are consistent with the reference bits or otherwise that the cell at the LSB of the row stores a bit consistent with a reference bit. Each column of the array includes a logic circuit for masking the bits except those continuous from the MSB toward the LSB which correspond to the bits of a word having the most bits continuous from the MSB toward the LSB and consistent with the bits of the reference word among the stored words. The NAND circuit in a row of the cells storing a word having the most bits continuous from the MSB toward the LSB and consistent with the corresponding bits of a reference word develops a signal representing the longest coincidence data detected.

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENTS

Figure 2:
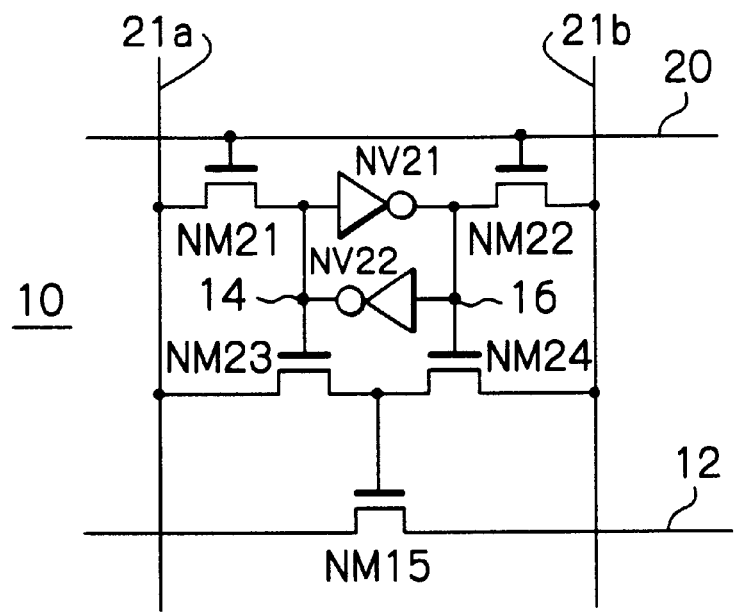
FIG. 2 shows in a schematic circuit diagram one CAM cell of the associative memory shown in FIG. 1.

First, with reference to FIG. 2, one of CAM (Content Addressable Memory) cells of an associative memory in accordance with a preferred embodiment of the present invention, generally denoted with a reference numeral 10, includes an SRAM (Static Random Access Memory) circuit comprising a couple of NMOS (N type Metal Oxide Semiconductor) transistors NM21 and NM22 and a couple of inverters NV21 and NV22 interconnected to a pair of bit lines 21a and 21b complementary to each other, as illustrated. The NMOS transistors NM21 and NM22 have gate electrodes thereof interconnected to a word line 20 as shown. The SRAM circuit is thus formed between the complementary bit lines 21a and 21b and the word line 20 crossing the former, and functions as a storage unit for storing one bit of data. The SRAM circuit is further interconnected as illustrated to NMOS transistors NM15, NM23 and NM24, which function as a comparison circuit for comparing a bit of data stored with a input reference bit of data. The NMOS transistor NM15 has its conductive path or source-drain path inserted into a match line 12, as depicted. Although the illustrative embodiment is of N type MOS transistors, the invention may of course be implemented by the opposite conductivity type of MOS transistors.

Figure 1:
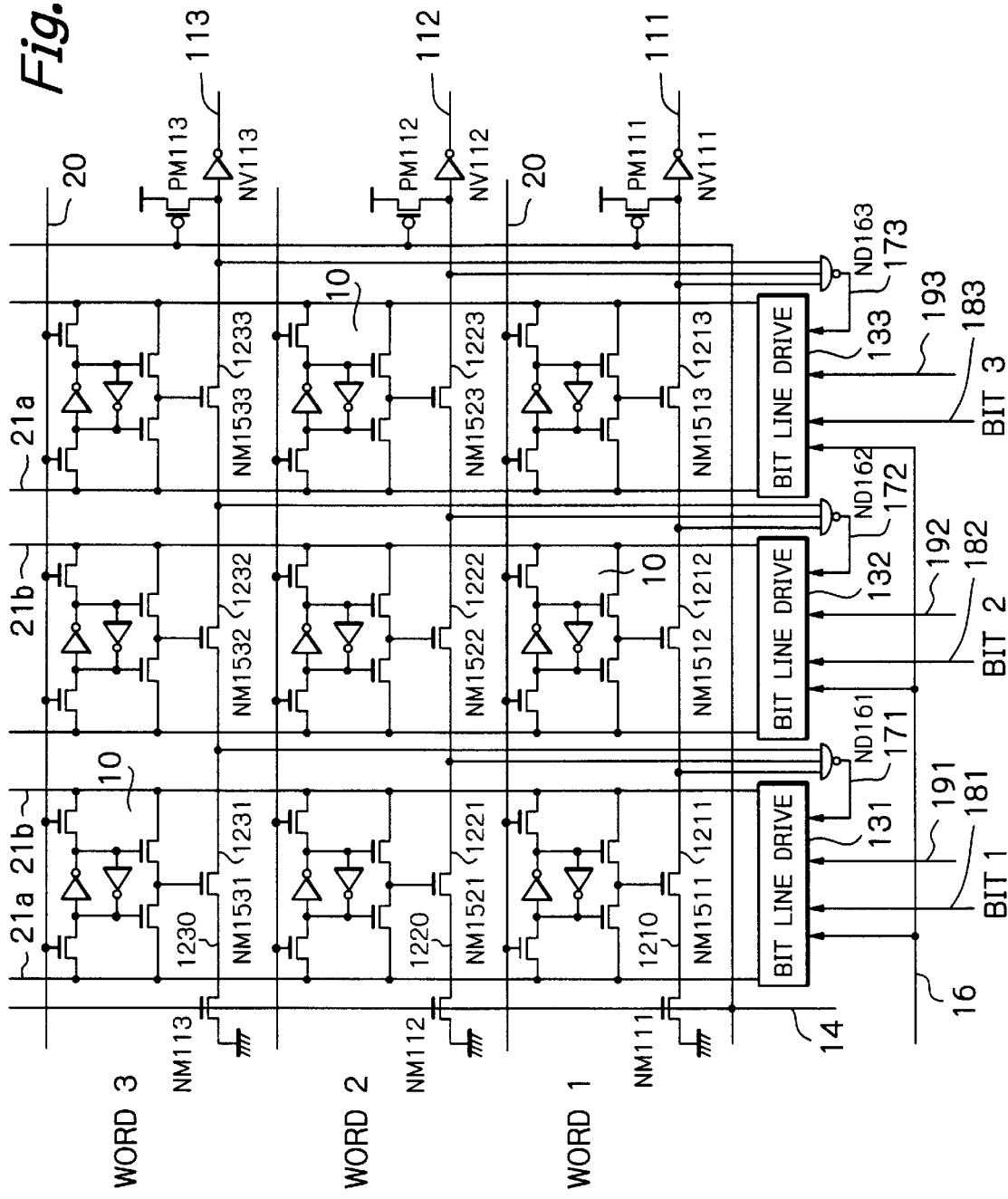
FIG. 1 is a schematic circuit diagram showing part of a preferred embodiment of an associative memory in accordance with the present invention.

Now, with reference to FIG. 1, the associative memory in accordance with the preferable embodiment of the invention includes an array of three rows of CAM cells 10, each of the rows consisting of three CAM cells 10, just for the purpose of describing the invention. The CAM cells 10 in each row are arryinged horizontally and have the word line 20 thereof interconnected to each other to correspond to one word of data. Three of those rows constitute the associative memory with the pairs of bit lines 21a and 21b interconnected to each other vertically. With the illustrative embodiment, the memory can thus store three words of data, each of the words including three bits. The illustrative embodiment is described merely for the purpose of understanding the invention, and may be generally extended to an array of m×n CAM cells 10, where m and n are natural numbers, such as 32 and 512, respectively. In the embodiment, bits 1 and 3 are the MSB and LSB, respectively.

More specifically, the row of CAM cells 10 corresponding to word 1, for example, have the NMOS transistors NM15 thereof connected in series across the cells 10 as illustrated. In FIG. 1, those NMOS transistors NM 15 are denoted with reference codes NM15 with two digits of numerals added which have the first and second digits designating the row and column numbers, i.e. bit and word numbers, respectively. The series of transistors NM1511, NM1512 and NM1513 has its one end 1210 interconnected through an NMOS transistor NM111 to a reference voltage, or ground, and its other end 1213 is connected through a PMOS (P type Metal Oxide Semiconductor) transistor PM111 to another reference voltage, to provide a precharge voltage, thus forming a general, dynamic NAND gate as a whole. The node 1213, at the LSB position, is interconnected to an inverter NV111 to develop an inverted voltage, which will be used for a utility circuit, not shown, as an output signal indicating the word 1. The transistors NM111 and PM111 have gate electrodes thereof connected in common to a precharge control signal line 14 as illustrated.

As can be understood from FIG. 1, the remaining rows of CAM cells 10, corresponding to words 2 and 3, are also structured in the same manner as the row corresponding to word 1. The control signal line 14 is accordingly connected to the gate electrodes of all of the precharging transistors NM111, NM112 and NM113 as well as PM111, PM112 and PM113. In FIG. 1, the associative memory includes drive circuits for driving the word lines 20, but they are not shown just for simplicity.

Now, with respect to the column of CAM cells corresponding to bit 1, the NMOS transistors NM1511, NM1512 and NM1513 have the drain electrodes 1211, 1212 and 1213 thereof, respectively, interconnected to input ports of a three-input NAND gate ND161, which has its output port 171 interconnected to an input port of a bit line drive 131, as shown. The NAND gate ND161 is adapted to perform NAND operation on its three inputs 1211, 1221 and 1231. In other words, the NAND gate ND161 functions as an OR gate with respect to negative-logic inputs whereas it does as an AND gate with respect to positive-logic inputs. In the specification, signals appearing in the circuitry are designated with the reference numerals designating connections on which the signals appear. The NAND gate ND161 may be implemented by a static NAND circuit, generally a CMOS circuit, or a dynamic NAND circuit.

The bit line drive 131 has, in addition to the input port 171, three other input ports, i.e. input data line 181, which is provided with an input bit of data which is to be written into one CAM cell 10 or a reference bit of data which is to be compared with a bit stored in one CAM cell 10, a mask setting line 191, and a bit line drive control signal line 16. The bit line drive 131 also has its pair of output ports interconnected to the pair of bit lines 21a and 21b, as illustrated.

As can be seen in FIG. 1, the associative memory includes additional bit line drives 132 and 133, which are provided correspondingly to bits or columns 2 and 3, and structured in the same manner as the bit line drive 131 corresponding to bit 1. More specifically, on input data lines 182 and 183, supplied are the remaining two input bits of data which are to be written into two CAM cells 10 or two references bits of data which are to be compared with bits stored in two CAM cells 10. The bit line drives 132 and 133 have mask setting lines 192 and 193, respectively. The bit line drive control signal line 16 is connected as shown in common to all of the bit line drives 131, 132 and 133.

The bit line drive 131 is adapted to be responsive to the control signal 16 to bring the pair of bit lines 21a and 21b to the high level thereof. The bit line drive 131 is also adapted to be responsive to the control signal 16 to make the logical state of the pair of bit lines 21a and 21b follow that of the input bit 181. In addition, the bit line drive 131 is adapted to receive the mask setting signal 191 to render its output bit lines 21a and 21b high when its input 171 from the associated NAND gate ND163 is high. The remaining bit line drives 132 and 133 are structured in the same manner as the drive 131.

Figure 5:
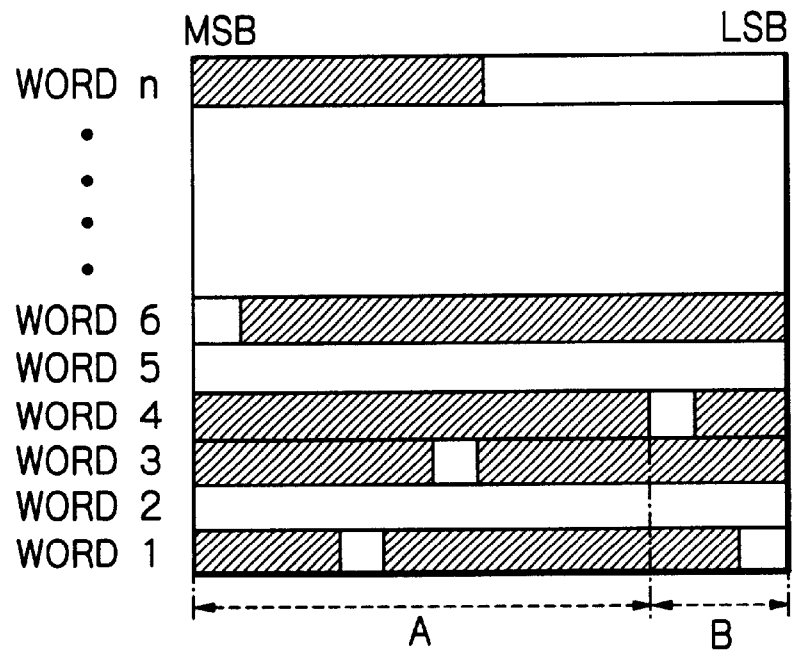
FIG. 5 schematically shows how words of data stored in the associative memory are coincident with an input reference word of data in the illustrative embodiments.

More generally, with reference to FIG. 5, the associative memory of the embodiment in accordance with the invention includes the CAM cells 10 in an array of n words, each of the words comprising a certain number of bits from its LSB to MSB, where n is a natural number such as 32. When the associative memory is provided with a reference word of data, the memory compares the reference word with each of the stored words 1, 2, 3, . . . , n. In the figure, exemplified results from the comparison are shown in such a manner that the bits stored in the memory that are consistent with the bits of the reference word are depicted with hatching while stored bits that are not consistent are shown in blank. The associative memory is adapted to find out, among the stored data of words I through n, to what extent of the bits are consistent with the corresponding bits of the reference word continuously from the MSB position thereof.

In the illustrated example, word 4 has the most coincident bits continuously from its MSB position, as designated by the capital letter A, among the n words stored. With the example, the memory is adapted to distinguish the extent A of the continuous coincidence bits from the remaining portion of bits B. In the specification, the operation mentioned above is referred to as a logical operation on a word basis. The associative memory, having thus distinguished the length of bits A from the length of bits B in the stored data, will set up mask bits corresponding to the length of bits B, and use those mask bits in the following fashion to identify word 4 as the longest coincidence word of data among the words of data stored in the memory. The latter operation mentioned above is referred to as the OR operation between corresponding bits in the specification.

Figure 6:
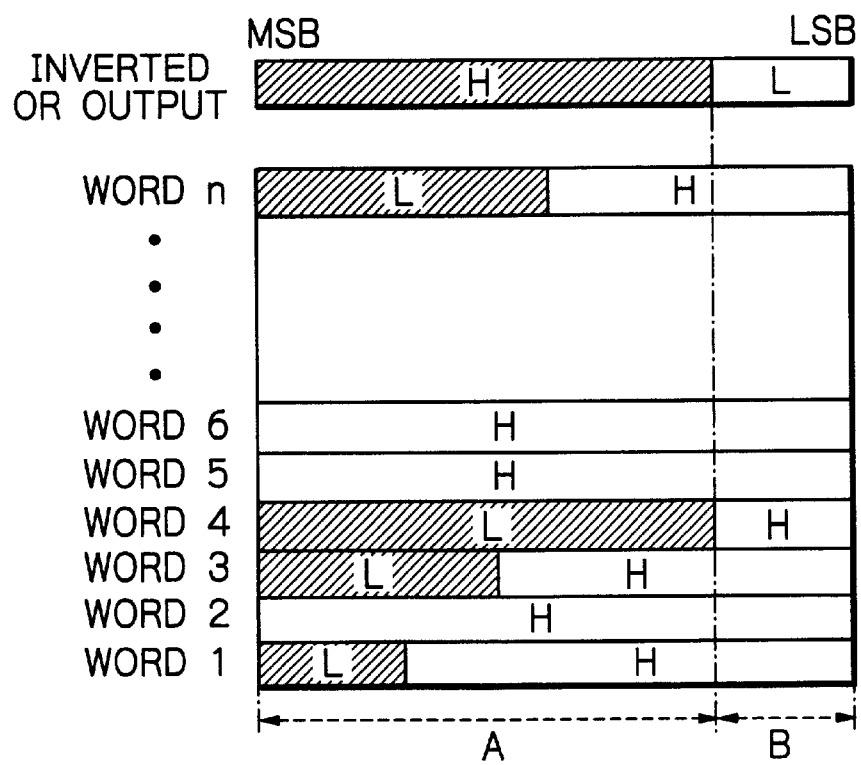
FIG. 6 is a chart useful for understanding how logical operations are made on words of data stored in the associative memory with respect to an input reference word of data and OR operations are made on each bit position between the stored words in the illustrative embodiments.

More specifically, with reference to FIG. 6, the illustrative embodiment of the associative memory is first operative in the logical operation on a word basis. The associative memory, upon being fed with a reference word of data, compares the reference word with stored words of data, in such a manner that ones of the CAM cells 10 of each row which have stored bits that are continuous from the MSB position of the word and coincident with the corresponding bits of the reference word render the match line 12 thereof to the low (L) level, with the remaining CAM cells 10 of each row rendering the match line 12 thereof to the high (H) level. In addition, the CAM cells 10 of the LSB position of the rows develop the logical state thereof on the output ports of the associative memory. With the illustrative embodiment in FIG. 1, the inverters NV111, NV112 and NV113 produce the inverted state of the CAM cells 10 of the LSB position of the rows. As an example, in FIG. 5, the bits of the stored words coincident with the corresponding bits of the reference word input are depicted with the hatching, and in FIG. 6, the logical levels H and L of the match lines 12 are shown with the most coincidence bits continuous from the MSB position hatched with the same example as FIG. 5.

The associative memory will then proceed to the OR operation between corresponding bits. The logical states of all the match lines 12 of each column or bit position are ORed with respect of negative-logic inputs, so that among the columns of the associative memory the OR operation causes a column or columns in which any match lines 12 present the low level thereof to produce the low-level output thereof. This corresponds to the AND operation with respect to positive-logic inputs, i.e. among the columns of the memory only a column or columns in which the entire match lines 12 present the high level thereof produce or produces the high-level output thereof. Consequently, it can be said that the OR operation between corresponding bits determines the extent of ones of the columns of the memory which correspond to the most coincidence bits continuous from the MSB position. With the specific example shown in FIG. 6, resultant information representing the extent of A or B, corresponding to word 4, will be obtained in its inverted form, as illustrated in the top part of the figure. In the illustrative embodiment shown in FIG. 1, the OR operation between corresponding bits is implemented by the NAND gates ND161, ND162 and ND163.

More specifically, in operation, the CAM cell 10 works in the same manner as a conventional SRAM so far as the writing operation of a bit of input data is concerned. For example, the CAM cell 10, FIG. 2, operates with positive logic and one bit line (21a) of the complementary bit lines 21a and 21b is the positive phase. In order to write a binary "1" into the CAM cell 10, the bit lines 21a and 22b are placed at high and low levels, respectively, by the associated bit line drive, e.g. 131, with the word line 20 being kept at a high level, resulting in the transistors NM21 and NM22 becoming conductive. This causes the potential of the gate electrode 14 of the storage transistor NM23 to be raised. By contrast, in order to write in a binary "0" into the CAM cell 10, the bit lines 21a and 22b are rendered low and high, respectively. This causes the potential of the gate electrode 16 of the storage transistor NM24 to be raised. Although the illustrative embodiment is directed to positive logic, the invention may of course be applied to negative logic devices.

In the searching or reference mode of the CAM cell 10, the word line 20 is placed at the low level to cause the transistors NM21 and NM22 to be non-conductive. A bit of reference data is then applied from the associated bit line drive, e.g. 131, to the complementary bit lines 21a and 21b in such a fashion that the bit lines 21a and 21b take the high and low levels thereof, respectively, representing a binary "1", and vice versa. For example, when a binary "1" is stored in the CAM cell 10, the transistor NM23 is maintained conductive. Under the circumstances, if a binary "1" is applied to the cell 10 as a reference bit, i.e. the bit line 21a is rendered high, then the transistor NM15 goes to its conductive state. If a binary "0" is applied to the cell 10, the transistor NM15 becomes non-conductive. By contrast, when a binary "0" is stored in the CAM cell 10, the other transistor NM24 is maintained conductive. If a binary "0" is applied to the cell 10 as a reference bit, i.e. the bit line 21b is rendered high, then the transistor NM15 goes to its conductive state. If a binary "1" is applied to the cell 10, the transistor NM15 becomes non-conductive. This implies that when the bit stored in the CAM cell 10 is consistent with the bit of a reference word supplied, the transistor NM15 is rendered conductive, and otherwise it is non-conductive.

In order to mask a bit position during the comparison operation, the couple of bit lines 21a and 21b of a CAM cell 10 of that bit position are both brought to the high level thereof by the associated bit line drive 131, for example. This causes the transistor NM15 to be conductive irrespective of the conductive state of the storage transistors NM23 and NM24, i.e. the stored bit of the CAM cell 10, thus resulting in the conductive state of the transistor NM15. This logical state of the CAM cell 10 is equivalent to that of a coincidence occurring on that bit, so the stored bit is excluded from comparison with a reference bit, that is, it is masked.

Now, returning to FIG. 1, the bit line drives 131, 132 and 133 are responsive to the control signal 16 generated by a control circuit, not shown, to render the pair of bit lines 21a and 21b to the high level thereof to cause the NMOS transistors NM1511–NM1513, NM1521–NM1523 and NM1531–NM1533 to be conductive, respectively. Then, the precharge signal 14 goes to its low level by the not-illustrated control circuit, giving rise to the PMOS transistors PM111, PM112 and PM113 becoming conductive and the NMOS transistors NM111, NM112 and NM113 becoming non-conductive. This causes the nodes 1210–1213, 1220–1223 and 1230–1233 to be rendered high, so that the NAND gates ND161, ND162 and ND163 produce the low level on the outputs 171, 172 and 173, respectively.

The bit line drives 131, 132 and 133 are then fed with the control signal 16 so as to receive the respective bits of the reference word. Thereafter, the precharge signal 14 is returned to its high level to render the PMOS transistors PM111, PM112 and PM113 non-conductive and the NMOS transistors NM111, NM112 and NM113 conductive. For example, if the bit line drive 133 receives its mask setting signal 193, then the drive 133 brings its output bit lines 21a and 21b high.

As described earlier, the transistor NM15 of a CAM cell 10 becomes conductive when that cell 10 stores therein a bit consistent with a corresponding bit of a reference word input. For example, when a coincidence occurs on the bits 1, 2 and 3 of the word 1 in the array of CAM cells 10 shown in FIG. 1, the node 1213 at the LSB position of the word 1 becomes low to cause the inverter NV111 to develop the high level on its output 111. As will be understood from this situation, only whenever all of the bits of a word stored are consistent with those of a reference word, will the output from the inverter (such as NV111) of that word be rendered high.

Figure 7:
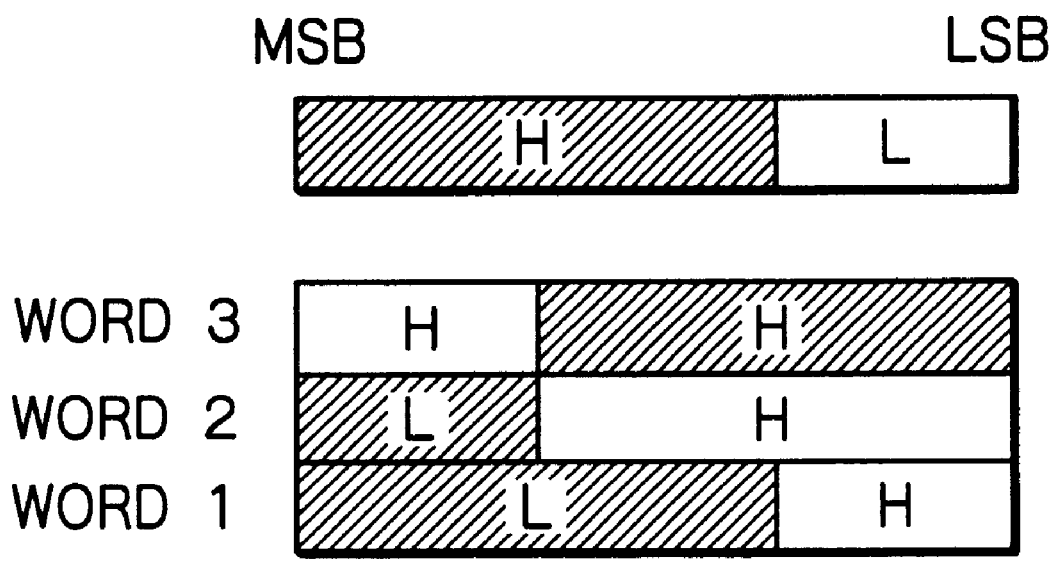
FIG. 7 is a chart useful for understanding how the longest coincidence data detection is performed in the illustrative embodiments.

Referring now to FIG. 7, a three-bit reference word of data is applied to the array of CAM cells 10 shown in FIG. 1, so that coincidences occur just with the bits 1 and 2 of the word 1, the bit 1 of the word 2, and the bits 2 and 3 of the word 3, as depicted with the hatching in FIG. 7. Under the circumstances, all the inverters NV111, NV112 and NV113 produce the low-level outputs 111, 112 and 113, respectively. In this stage of comparing operation, if any of the rows 1, 2 and 3 outputs a positive or high level on its corresponding output 111, 112 or 113, namely, the word stored in the row is fully consistent with the reference word entered, then the associative memory may finish the comparison operation without proceeding to the second comparing operation described later.

Under the instant situation, the transistors NM1511 and NM1512 of the row or word 1 are conductive and the remaining one NM1513 is non-conductive so that the nodes 1211 and 1212, associated with the extent from the MSB bit to the second bit, are low, while the node 1213, the remaining bit, is high, as depicted in FIG. 7. Similarly, the transistor NM1521 of the row or word 2 is conductive and the remaining ones NM1522 and NM1523 is non-conductive so that the node 1221, associated with the MSB bit, is low and the nodes 1222 and 1223, associated with the remaining bits, are high. Further, the transistors NM1532 and NM1533 of the row or word 3 are conductive and the remaining one NM1531 is non-conductive so that all the nodes 1231, 1532 and 1533, extending from the MSB bit to the LSB bit, are maintained high.

As seen from FIG. 7, the dynamic NAND gate, consisting of the three transistors NM 1511, NM1512 and NM1513, connected in serial, of the row or word 1 receives as its three inputs the low level in the extent continuous from the MSB position to the second bit position coincident with the corresponding bits of the reference word, and the high level in the extent of the remaining bit to the LSB position, the LSB per se in the example. Further, the logical state, low in the example, of the transistor NM1513, corresponding to the LSB bit, is inverted by the inverter NV111 to be output from the output port 111. The remaining dynamic NAND gates, consisting of the transistors NM1521, NM1522, NM1523, and NM1531, NM1532, NM1533, connected in serial, of the rows or words 2 and 3, respectively, achieve the same operation as that of the row 1.

The three-input NAND gate ND161 receives the logical state of the nodes 1211, 1221 and 1231. With the exemplified case shown in FIG. 7, the NAND gate ND161 produces its high level from its port output 171 to the bit line drive 131 associated therewith. Similarly, the three-input NAND gate ND162 receives the low level of the node 1212 and the high level of the nodes 1222 and 1232, with the exemplified case, to produce its high output from its port 172 to the bit line drive 132. The remaining three-input NAND gate ND 163 receives the high level of the nodes 1213, 1223 and 1233, with the exemplified case, to produce the low level from its port 173 to the bit line drive 133.

It is important to note that the high level signals 171 and 172 developed from the NAND gates ND161 and ND162, respectively, represent the extent of bit positions of the stored word which are continuously coincident from the MSB position with the corresponding bits of the reference word, resultantly from the OR operation made on the low state of the nodes 1211, 1221, 1231, and 1212, 1222, 1232, respectively. In other words, the outputs 171, 172 and 173 from the NAND gates ND161, ND162 and ND163, respectively, represent to what extent the bits of the words stored in the associative memory are coincident continuously from the MSB position of the reference word. In the instant example, the high level developed from the NAND gates ND161 and ND162 represents that two continuous bit positions from the MSB involve coincidence due to the fact that word 1 has its MSB and second bits coincident with the corresponding bits of the reference word. The outputs 171, 172 and 173 are referred to as a longest coincidence signal in the specification.

With this exemplified case, only the NAND gate ND 163 delivers its high level 173 to the associated bit line drive 133. The bit line drive 133 in turn produces high-level signals on its pair of bit lines 21a and 21b under the control of the signal provided. This means that the bit 3 is masked from the following comparison operation. In response, in column 3, with this example, the transistors NM1513 and NM1523 become conductive in addition to the transistor NM1533 that is already conductive. In the row 1, since the transistors NM111, NM1511 and NM1512 are already made conductive, the rendering conductive of the transistor NM1513 now causes the inverter NV111 to produce the high level on its output 111. On the other hand, the rows 2 and 3 still include the non-conductive transistors NM1522 and NM1531 and the nodes 1223 and 1233 are maintained at the high level, so the low level is developed on the outputs 112 and 113 from the inverters NV112 and NV113, respectively. The row or word 1, producing the high level output 111, is thus identified as the longest coincidence data with respect to the reference word input.

With the illustrative embodiment described above, comparison operations are performed merely twice, namely, a first comparison without using bit masking to determine which of the bit positions are to be masked and thereafter a second comparison with a mask bit or bits thus determined being used, irrespective of how many bits a reference word includes. It is to be noted that the associative memory may be adapted to accomplish only the first comparing operation without advancing to the second comparing operation in an application in which such a word of data stored in the memory which is completely coincident with a reference word of data is to be searched for.

Figure 3:
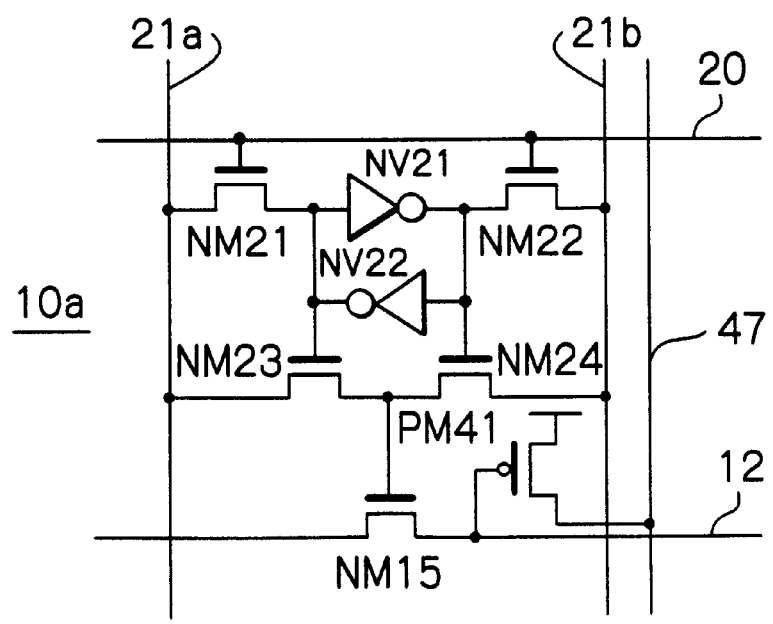
FIG. 3 is a schematic circuit diagram, similar to FIG. 2, showing one CAM cell of an associative memory in accordance with an alternative embodiment of the present invention.

Now referring to FIG. 3, a CAM cell 10a included in an alternative embodiment of the invention comprises an additional PMOS transistor PM41, which has its gate, source and drain electrodes connected to the match line 12, a reference voltage and a longest coincidence line 47, respectively.

Figure 4:
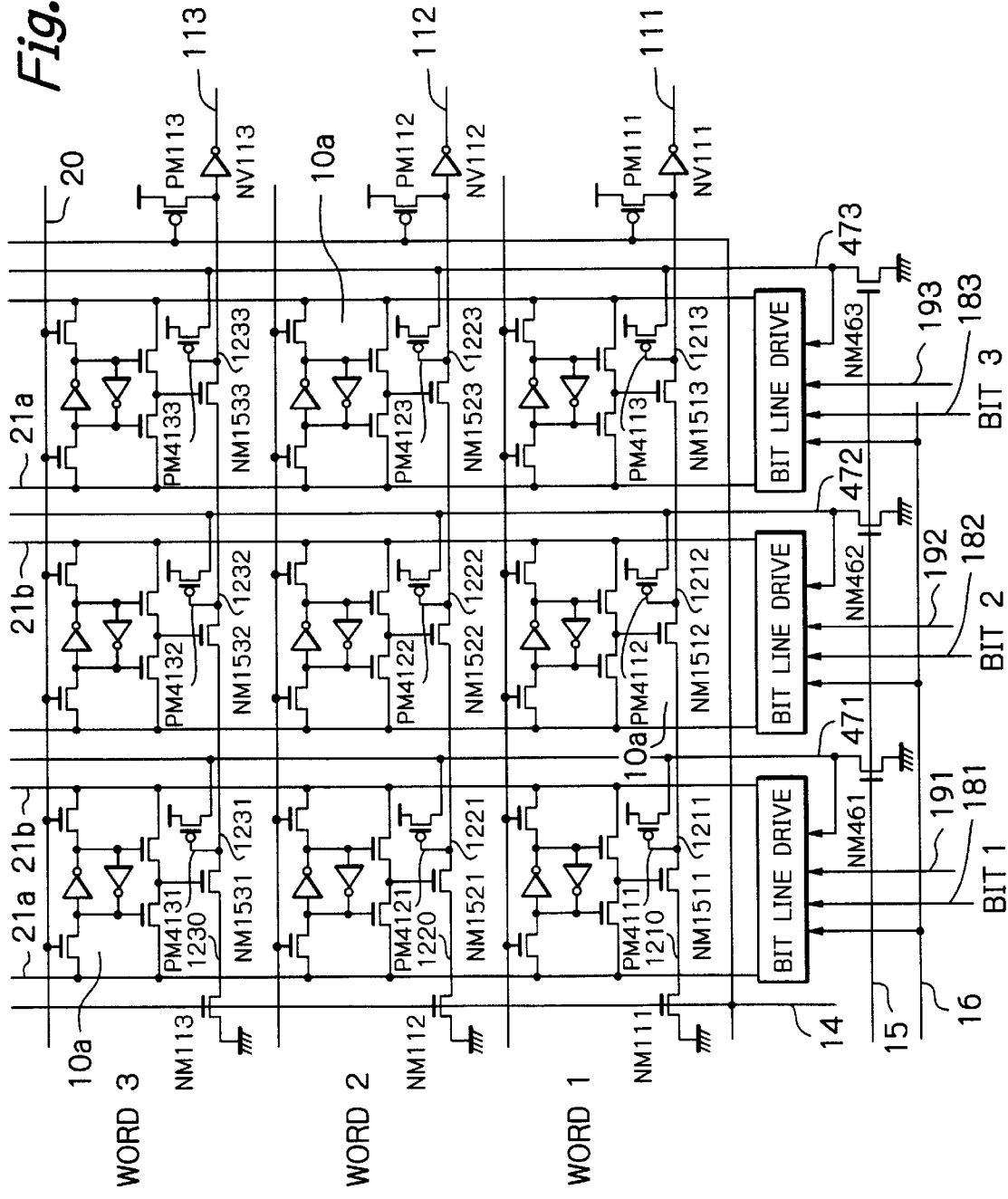
FIG. 4 is a schematic circuit diagram, similar to FIG. 1, showing part of the associative memory in accordance with the alternative embodiment.

In the embodiment shown in FIG. 4, the CAM cells 10a are arranged in an array of three rows and three columns for the purpose of describing the invention only. In the specification, like elements are denoted with the same reference numerals, without repeating a redundant explanation thereon. In the array thus shown, the column 1 includes a longest coincidence line 471, which interconnects in common the PMOS transistors PM4111, PM4121 and PM4131. In the remaining columns 2 and 3, longest coincidence lines 472 and 473 interconnect the PMOS transistors PM4112, PM4122, PM4132, and PM4113, PM4123, PM4133, respectively, in common.

The longest coincidence lines 471, 472 and 473 are connected on one hand to an input port corresponding to the ports 171, 172 and 173 of the bit line drives 131, 132 and 133, respectively, shown in FIG. 1, and on the other hand to the ground, a reference voltage, through additional NMOS transistors NM461, NM462 and NM463, respectively. The NMOS transistors NM461, NM462 and NM463 are for use in discharging the longest coincidence lines 471, 472 and 473, respectively, and have the gate electrodes interconnected in common to a discharge signal 15. In FIG. 4, the PMOS transistors PM41 (FIG. 3) are denoted with the reference code PM41 plus two added digits which designate the row and column numbers, respectively. The longest coincidence lines 47 (FIG. 3) are denoted with the reference numeral 47 also with one digit added to designate the column number.

In operation, the CAM cell 10a operates in the same manner as the CAM cell 10 in storing a bit and comparing a stored bit with a reference bit. The array of CAM cells 10a also operates in the same manner as the array of CAM cells 10. More specifically, the bit line drives 131, 132 and 133 are controlled in response to the control signal 16 to render the pair of bit lines 21a and 21b to the high level thereof to cause all the NMOS transistors NM1511–NM1513, NM1521–NM1523 and NM1531–NM1533 to be conductive, respectively. Then, the precharge signal 14 becomes low to render the PMOS transistors PM111, PM112 and PM113 conductive and the NMOS transistors N111, NM112 and NM113 non-conductive, resulting in the high states of the nodes 1210–1213, 1220–1223 and 1230–1233. During this period of operation, the high levels of the nodes 1211, 1212 and 1213 render the transistors PM4111, PM4112 and PM4113 non-conductive, respectively, which have the drains thereof connected to the longest coincidence lines 471, 472 and 473, respectively.

Following that, the high level of the discharge signal 15 is applied to the gate electrodes of the discharge NMOS transistors NM461, NM462 and NM463 by a control circuit, not shown, to render the source-drain paths thereof conductive and to thereby render the longest coincidence lines 471, 472 and 473 low. Thereafter, the discharge signal 15 returns to its low level so that the NMOS transistors NM461, 462 and 463 go to the non-conductive states thereof. Successively, the control signal 16 is applied to the bit line drives 131, 132 and 133 with the bits of reference word 181, 182 and 183 applied thereto, respectively. The precharge signal 14 is then returned to its high level to place the PMOS transistors PM111, PM112 and PM113, and the NMOS transistors NM111, NM112 and NM113 in the non-conductive and conductive states thereof, respectively.

In the case of the example described with reference to FIG. 7, coincidences occur just with the bits 1 and 2 of the word 1, the bit 1 of the word 2, and the bits 2 and 3 of the word 3, so that all the inverters NV111, NV112 and NV113 produce the low-level outputs 111, 112 and 113, respectively, as described before with reference to the embodiment shown in FIG. 1. That is also the case with the alternative embodiment.

More specifically, the transistors NM1511 and NM1512 of the row 1 are conductive and the remainder NM1513 is non-conductive so that the nodes 1211 and 1212 are low while the node 1213 is high. The transistor NM1521 of the row 2 is conductive and the remaining ones NM1522 and NM1523 are non-conductive so that the node 1221 is low and the nodes 1222 and 1223 are high. The transistors NM1532 and NM1533 of the row 3 are conductive and the remaining one NM1531 is non-conductive so that all the nodes 1231, 1532 and 1533 are maintained high.

The conductive state of the PMOS transistors PM4111 and PM4121 brings the longest coincidence line 471 of the column or bit 1 high. Similarly, the conductive state of the PMOS transistor PM4112 brings the longest coincidence line 472 of the column or bit 2 to its high level. The longest coincidence line 473 of the column or bit 1 is kept low since the PMOS transistors PM4113, PM4123 and PM4133 take the non-conductive state thereof As will be understood, the logical state of the longest coincidence lines 471, 472 and 473 represent to what extent the bits of the words stored in the associative memory are coincident continuously from the MSB position of the reference word. In other words, the lines 471, 472 and 473 produce signals equivalent to the longest coincidence signals as described with reference to the embodiment shown in FIG. 1.

Only the longest coincidence line 473 emits the low level to its associated bit line drive 133 with the instant example. The bit line drive 133 in turn produces high-level signals on its pair of bit lines 21a and 21b in response to the signal provided. The bit 3 will thus be masked from the following comparison operation. In response, the column 3, with this example, the transistors NM1513 and NM1523 become conductive in addition to the transistor NM1533 that is already conductive. In the row 1, the transistors NM111, NM1511 and NM1512 are already conductive, and the rendering conductive of the transistor NM1513 now causes the inverter NV111 to produce the high level on its output 111. On the other hand, the rows 2 and 3 still include the non-conductive transistors NM1522 and NM1531, respectively, to keep the nodes 1223 and 1233 at the high level, so that the outputs 112 and 113 from the inverters NV112 and NV113 are low. The row or word 1 is thus identified as the longest coincidence data with respect to the reference word input.

The alternative embodiment involves the same advantages described with reference to the embodiment shown in FIG. 1. In addition, the associative memory including the CAM cells 10a in accordance with the alternative embodiment is smaller in size and more rapid in operational speed than the associative memory including the CAM cells 10 of the FIG. 1 embodiment. Because, in order to produce the longest coincidence signals, the associative memory including the CAM cells 10a in accordance with the alternative embodiment does not include the static or dynamic NAND circuits ND161, ND162 and ND163 requiring wiring connections provided for all of the bits of each row, but merely the wiring connections for the longest coincidence lines 471, 472 and 473 each provided in common to the rows and the associated MOS devices. That advantage is more predominant in applications where a larger number of word storage locations are included.

In summary, in accordance with the present invention, comparison operations are executed merely twice, i.e. a first operation is performed without using bit masking to determine which of the bit positions are to be masked, and thereafter a second operation with a mask bit or bits thus determined being used, irrespective of how many bits a reference word includes. The associative memory therefore accomplishes the longest coincidence data detection in a minimized period of time with its power consumption minimized. The associative memory is advantageously applicable to telecommunications network systems.

The entire disclosure of Japanese patent application No. 2000-8714 filed on Jan. 18, 2000, including the specification, claims, accompanying drawings and abstract of the disclosure is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. An associative memory, comprising:
   a plurality of bit lines;
   a plurality of word lines;
   an array of CAM (Content Addressable Memory) cells connected to the bit lines and the word lines, the CAM cells being arranged in rows corresponding to words of data and columns corresponding to bits of words, each CAM cell including first means for storing a bit and second means for comparing the stored bit with a bit of a reference word, the second means of each CAM cell including a predetermined transistor having a source/drain conduction path, the source/drain conduction paths of the predetermined transistors in a row of CAM cells being connected in a series connection corresponding to the respective row;
   a plurality of logic circuits, each logic circuit corresponding to a column of CAM cells and having input terminals that are connected, at connection points adjacent the corresponding column of CAM cells, to the series connections in all of the rows; and
   a plurality of drive circuits for the bit lines, each drive circuit corresponding to one of the columns of CAM cells and receiving a signal from the corresponding logic circuit.

2. The memory of claim 1, wherein the bits stored in the CAM cells are transferred from the drive circuits to the CAM cells via the bit lines, and the bits of the reference word are also transferred from the drive circuits to the CAM cells via the bit lines.

3. The memory of claim 2, wherein the particular transistor of a CAM cell takes either a first state, if the bit stored by the CAM cell and the reference bit to which it is compared are identical, or a second state, if they are not identical, and further comprising a plurality of additional logic circuits, each additional logic circuit being connected to the series connection of a corresponding row of CAM cells adjacent an LSB position in the row, the additional logic circuit that is connected to a series connection having a predetermined output if and only if all of the particular transistors in the series connection are in the first state.

4. The memory of claim 3, wherein the logic circuit corresponding to a column of CAM cells has a predetermined output if and only if all of the particular transistors in the CAM cells of the corresponding column are in the first state.

5. The memory of claim 1, wherein the particular transistor of a CAM cell takes either a first state, if the bit stored by the CAM cell and the reference bit to which it is compared are identical, or a second state, if they are not identical, and wherein the logic circuit corresponding to a column of CAM cells has a predetermined output if and only if all of the particular transistors in the CAM cells of the corresponding column are in the first state.

6. The memory of claim 5, wherein the drive circuit corresponding to a column of CAM cells masks the second means of the CAM cells in the corresponding column if the logic circuit corresponding to the column of CAM cells has the predetermined output.

7. An associative memory, comprising:
   a plurality of bit lines;
   a plurality of longest coincidence lines arranged generally parallel to the bit lines;
   a plurality of word lines arranged transverse to the bit lines and the longest coincidence lines;
   an array of CAM (Content Addressable Memory) cells connected to the bit lines and the word lines, the CAM cells being arranged in rows corresponding to words of data and columns corresponding to bits of words, each CAM cell including
     first means for storing a bit,
     second means for comparing the stored bit with a bit of a reference word, the second means of each CAM cell including a first transistor having a source/drain conduction path, the source/drain conduction paths of the first transistors in a row of CAM cells being connected in a series connection corresponding to the respective row, and
     a second transistor connected to the first transistor, the second transistors in a column of CAM cells additionally being connected to one of the longest coincidence lines that corresponds to the column; and a plurality of drive circuits for the bit lines, each drive circuit corresponding to one of the columns of CAM cells and receiving a signal from the corresponding longest coincidence lines.

8. The memory of claim 7, wherein the bits stored in the CAM cells are transferred from the drive circuits to the CAM cells via the bit lines, and the bits of the reference word are also transferred from the drive circuits to the CAM cells via the bit lines.

9. The memory of claim 8, wherein the first transistor of a CAM cell takes either a first state, if the bit stored by the CAM cell and the reference bit to which it is compared are identical, or a second state, if they are not identical, and further comprising a plurality of logic circuits, each logic circuit being connected to the series connection of a corresponding row of CAM cells adjacent an LSB position in the row, the logic circuit that is connected to a series connection having a predetermined output if and only if all of the particular transistors in the series connection are in the first state.

10. The memory of claim 7, wherein the first transistor of a CAM cell takes either a first state, if the bit stored by the CAM cell and the reference bit to which it is compared are identical, or a second state, if they are not identical, and wherein second transistor has a predetermined output if the first transistor is in the first state.

11. The memory of claim 10, wherein the drive circuit corresponding to a column of CAM cells masks the second means of the CAM cells in the corresponding column if the second transistors of all of the CAM cells in the corresponding column have the predetermined output.

12. The memory of claim 11, wherein the first transistors are NMOS transistors and the second transistors are PMOS transistors.

13. The memory of claim 7, wherein the first transistors are NMOS transistors and the second transistors are PMOS transistors.

14. The memory of claim 7, further comprising discharge control transistors for selectively connecting the longest coincidence lines to a predetermined potential.

* * * * *